US012685225B2

(12) United States Patent
Maeda et al.

(10) Patent No.: US 12,685,225 B2
(45) Date of Patent: Jul. 14, 2026

(54) SEMICONDUCTOR DEVICE AND MANUFACTURING METHOD OF THE SAME

(71) Applicant: Kioxia Corporation, Tokyo (JP)

(72) Inventors: Takeori Maeda, Mie Mie (JP); Soichi Homma, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 438 days.

(21) Appl. No.: 18/325,769

(22) Filed: May 30, 2023

(65) Prior Publication Data

US 2023/0307422 A1 Sep. 28, 2023

Related U.S. Application Data

(62) Division of application No. 17/187,712, filed on Feb. 26, 2021, now abandoned.

(30) Foreign Application Priority Data

Jun. 19, 2020 (JP) ................................. 2020-106382

(51) Int. Cl.
| | |
|---|---|
| *H10W 90/00* | (2026.01) |
| *H10W 70/60* | (2026.01) |
| *H10W 70/65* | (2026.01) |
| *H10W 70/68* | (2026.01) |
| *H10W 70/692* | (2026.01) |
| *H10W 95/00* | (2026.01) |
| *H10W 72/00* | (2026.01) |

(52) U.S. Cl.
CPC .......... *H10W 90/00* (2026.01); *H10W 70/611* (2026.01); *H10W 70/65* (2026.01); *H10W 70/6875* (2026.01); *H10W 70/692* (2026.01); *H10W 95/00* (2026.01); *H10W 72/072* (2026.01)

(58) Field of Classification Search
CPC ...................... H01L 2021/60022; H01L 21/50
See application file for complete search history.

(56) References Cited

U.S. PATENT DOCUMENTS

| | | | |
|---|---|---|---|
| 6,960,878 | B2 | 11/2005 | Sakano et al. |
| 10,276,545 | B1 | 4/2019 | Huang et al. |
| 10,629,519 | B2 | 4/2020 | Chen et al. |
| 10,879,192 | B1 | 12/2020 | Kuan et al. |
| 2006/0175692 | A1 | 8/2006 | Hsu |
| 2007/0227765 | A1 | 10/2007 | Sakamoto et al. |
| 2008/0308917 | A1 | 12/2008 | Pressel et al. |
| 2010/0255637 | A1 | 10/2010 | Ishida et al. |

(Continued)

FOREIGN PATENT DOCUMENTS

| | | |
|---|---|---|
| JP | 3428597 B2 | 7/2003 |
| JP | 2011243724 A | 12/2011 |

(Continued)

*Primary Examiner* — Trang Q Tran
(74) *Attorney, Agent, or Firm* — Kim & Stewart LLP

(57) ABSTRACT

According to one or more embodiments, a semiconductor device includes a support having a recess. A plurality of semiconductor chips are stacked on each other in the recess. A plurality of columnar electrodes in the recess extend from the semiconductor chips toward an opening of the support. A wiring layer is disposed over the opening. The recess is filled with an insulating material to cover the semiconductor chips and the columnar electrodes.

9 Claims, 15 Drawing Sheets

(56) References Cited

U.S. PATENT DOCUMENTS

| | | | |
|---|---|---|---|
| 2010/0320588 A1 | 12/2010 | Dahilig et al. | |
| 2011/0090657 A1 | 4/2011 | Yoshino et al. | |
| 2012/0108053 A1 | 5/2012 | Tang et al. | |
| 2013/0027145 A1 | 1/2013 | Yoshida | |
| 2013/0135844 A1 | 5/2013 | Chang et al. | |
| 2014/0062607 A1 | 3/2014 | Nair et al. | |
| 2015/0015249 A1 | 1/2015 | Ausserlechner et al. | |
| 2015/0255427 A1* | 9/2015 | Sung | H01L 23/5383 |
| | | | 257/737 |
| 2015/0348954 A1 | 12/2015 | Chandolu | |
| 2016/0005717 A1 | 1/2016 | Lin et al. | |
| 2016/0079222 A1 | 3/2016 | Sato | |
| 2016/0365340 A1 | 12/2016 | Tajima et al. | |
| 2017/0110439 A1 | 4/2017 | Yuan et al. | |
| 2017/0186737 A1 | 6/2017 | Fang et al. | |
| 2018/0158770 A1 | 6/2018 | Lin et al. | |
| 2018/0211936 A1 | 7/2018 | Chang et al. | |
| 2019/0237382 A1 | 8/2019 | Kim et al. | |
| 2020/0066613 A1 | 2/2020 | Lee et al. | |
| 2020/0203313 A1 | 6/2020 | Chen et al. | |
| 2020/0357750 A1 | 11/2020 | Chen et al. | |
| 2021/0167039 A1* | 6/2021 | Zeng | H01L 21/6835 |
| 2021/0398946 A1 | 12/2021 | Maeda et al. | |
| 2022/0199582 A1 | 6/2022 | Luan | |

FOREIGN PATENT DOCUMENTS

| | | |
|---|---|---|
| JP | 2012015446 A | 1/2012 |
| JP | 2012059730 A | 3/2012 |
| TW | 201807771 A | 3/2018 |
| TW | 201834090 A | 9/2018 |
| TW | 201943039 A | 11/2019 |

* cited by examiner

SEMICONDUCTOR DEVICE AND MANUFACTURING METHOD OF THE SAME

CROSS-REFERENCE TO RELATED APPLICATIONS

This application is a division of U.S. patent application Ser. No. 17/187,712, filed Feb. 26, 2021, which is based upon and claims the benefit of priority from Japanese Patent Application No. 2020-106382, filed Jun. 19, 2020, the entire contents of each of which are incorporated herein by reference.

FIELD

Embodiments described herein relate generally to a semiconductor device and a manufacturing method of the same.

BACKGROUND

A plurality of semiconductor chips and a controller chip that constitute a single semiconductor package is called multi-chip package (MCP).

In such an MCP, if the semiconductor chips and the controller chip are encapsulated by resin, thermal contraction of the resin may cause a substrate to warp.

BRIEF DESCRIPTION OF THE DRAWINGS

FIG. 1 depicts an example configuration of a semiconductor device in a cross-sectional view according to a first embodiment.

FIG. 3A depicts an example of a manufacturing method of a semiconductor device in a perspective view according to a first embodiment.

FIG. 3B depicts an example of a manufacturing method of a semiconductor device in a cross-sectional view according to a first embodiment.

FIG. 7 depicts an example configuration of a semiconductor device in a cross-sectional view according to a modified first embodiment.

FIG. 9A depicts an example of a manufacturing method of a semiconductor device in a perspective view according to a third embodiment.

FIG. 9B depicts an example of a manufacturing method of a semiconductor device in a cross-sectional view according to a third embodiment.

FIG. 10A depicts an example of a manufacturing method of a semiconductor device in a perspective view according to a third embodiment.

FIG. 10B depicts an example of a manufacturing method of a semiconductor device in a cross-sectional view according to a third embodiment.

FIG. 12A depicts an example of a manufacturing method of a semiconductor device in a perspective view according to a third embodiment.

FIG. 12B depicts an example of a manufacturing method of a semiconductor device in a cross-sectional view according to a third embodiment.

FIG. 13A depicts an example of a manufacturing method of a semiconductor device in a perspective view according to a third embodiment.

FIG. 13B depicts an example of a manufacturing method of a semiconductor device in a cross-sectional view according to a third embodiment.

FIG. 14 depicts an example configuration of a semiconductor device in a cross-sectional view according to a modified first embodiment.

FIG. 15 depicts an example configuration of a semiconductor device in a cross-sectional view according to a modified first embodiment.

DETAILED DESCRIPTION

Figures 2A, 2B:
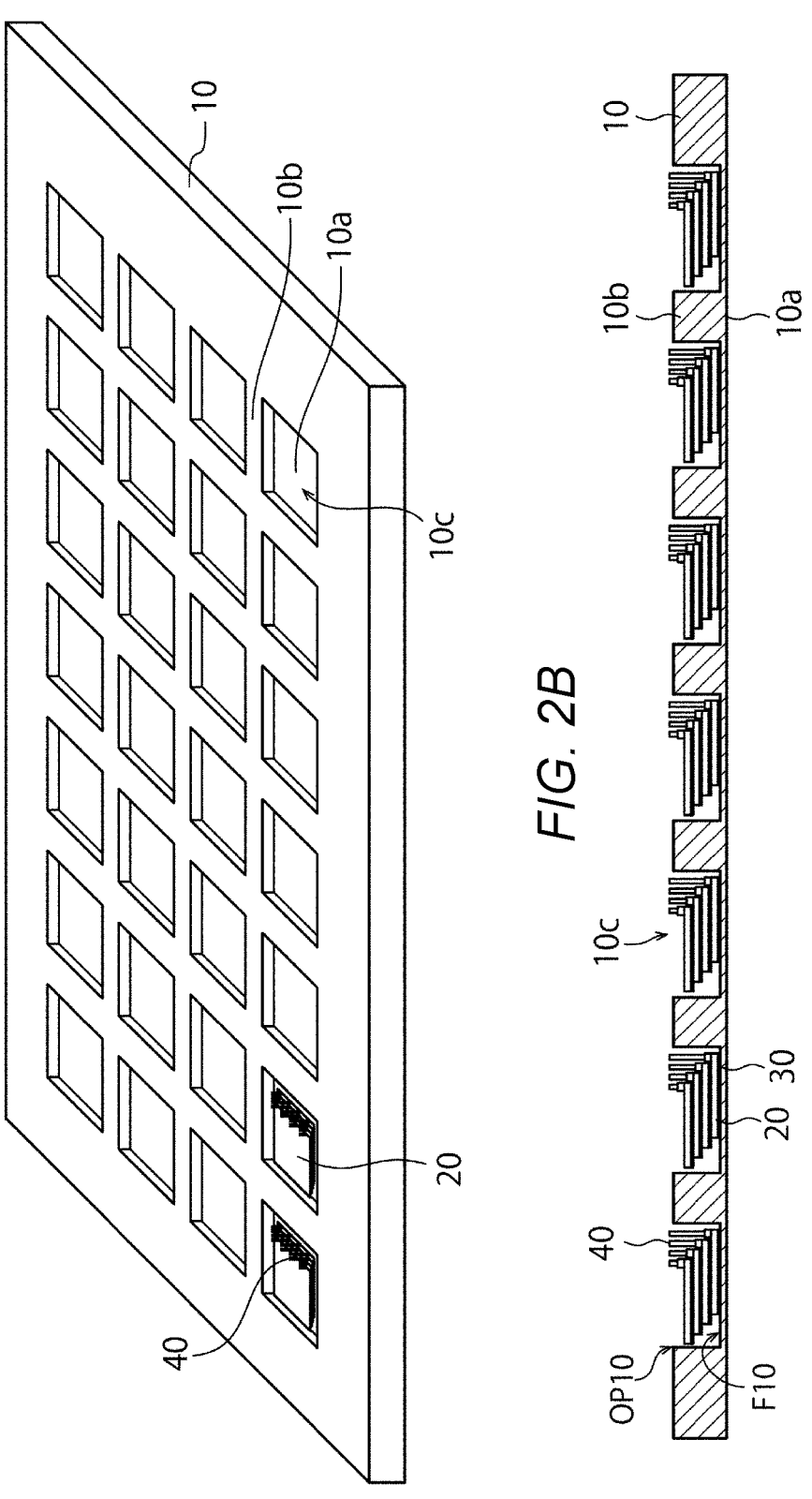
FIG. 2A depicts an example of a manufacturing method of a semiconductor device in a perspective view according to a first embodiment.
FIG. 2B depicts an example of the manufacturing method of a semiconductor device in a cross-sectional view according to a first embodiment.

Embodiments provide a semiconductor device and a manufacturing method of the same having reduced substrate warping even after semiconductor chips and a controller chip are encapsulated by a resin.

In general, according to one embodiment, a semiconductor device includes a support having a recess. A plurality of semiconductor chips are stacked on each other in the recess. A plurality of columnar electrodes in the recess extend from the semiconductor chips toward an opening of the support. A wiring layer is disposed over the opening of the support. The recess is filled with an insulating material to cover the semiconductor chips and the columnar electrodes.

Hereinafter, some example embodiments will be described with reference to the accompanying drawings. The disclosure is not limited to the examples. In the example embodiments, references to vertical directions (upper/lower, upward/downward, etc.) are directions relative to a surface on which the semiconductor chips are mounted faces. Such a surface is said to be upward facing. Such descriptive words related to vertical directions are used for explanatory convenience and from the described vertical directions are not necessarily accordance with a direction of gravitational acceleration.

The drawings are schematic or conceptual diagrams, and, as such, depicted dimensional proportions are not necessarily equal to actual devices. In the specification and the drawings, elements or aspects that are substantially the same in different drawings or described embodiments are denoted by the same reference symbols and may not be repeatedly described after an initial description.

First Embodiment

Figure 1:
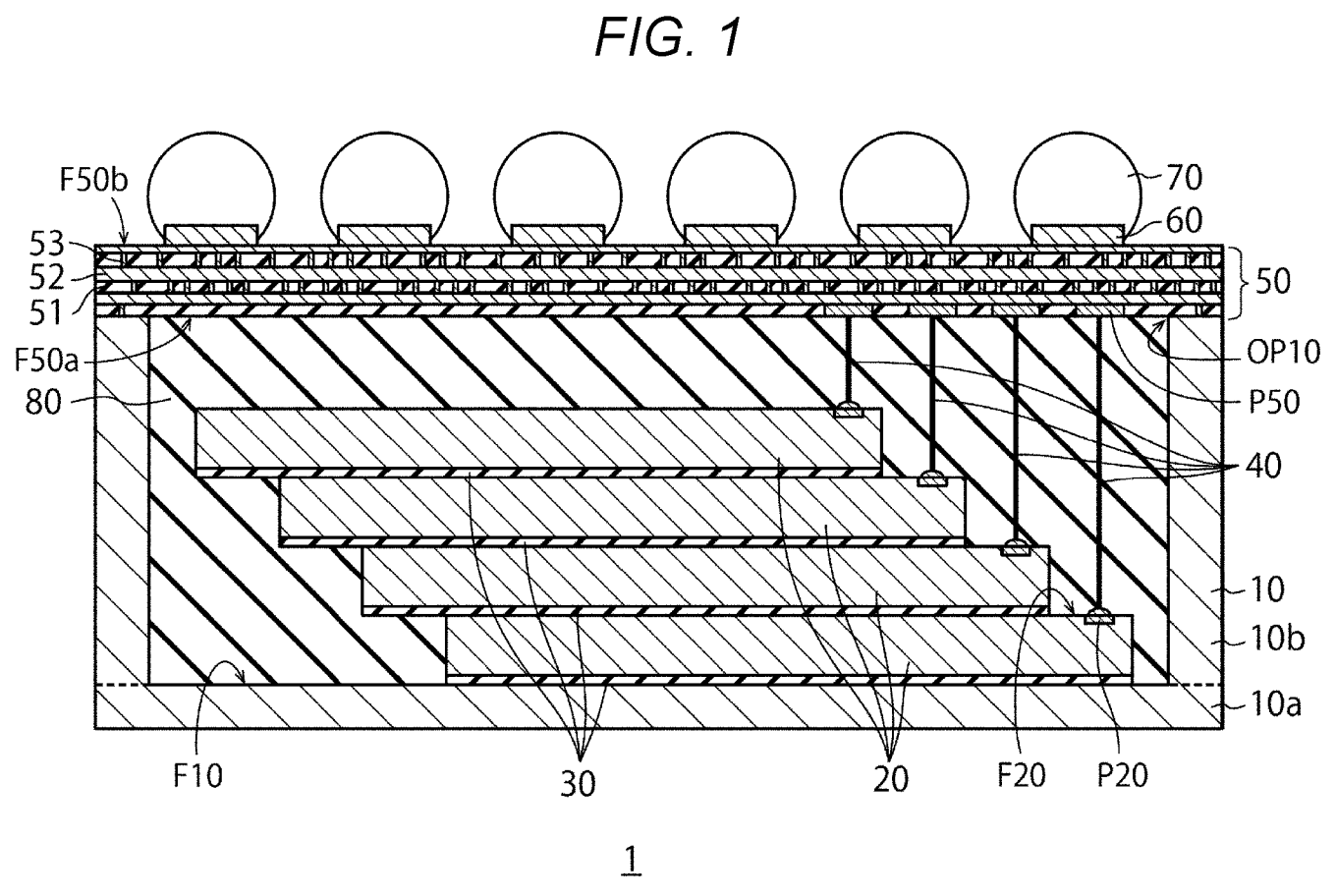

FIG. 1 depicts an example configuration of a semiconductor device 1 in a cross-sectional view according to a first embodiment. The semiconductor device 1 includes a support 10, a plurality of semiconductor chips 20, a plurality of adhesive layers 30, a plurality of columnar electrodes 40, a redistribution layer (RDL) 50, electrode pads 60, metal bumps 70, and an insulating material 80. The semiconductor device 1 may be, for example, a semiconductor package (a packaged semiconductor device) such as a NAND flash memory chip or a large-scale integration (LSI) chip.

The support 10 has a recessed portion or a recess and is shaped as a rectangular casing. More specifically, the support 10 includes a bottom portion 10a, on which the semiconductor chips 20 are mounted and a side portion 10b disposed on an outer edge of the bottom portion 10a. In the first embodiment, the bottom portion 10a and the side portion 10b are integral with each other and made of an identical material. The bottom portion 10a and the side portion 10b give the support 10 a recessed shape. The semiconductor chips 20 can be contained in a recess.

The support 10 may be made of either a conductive material or an insulating material. The support 10 may be made of a material having a hardness different from a hardness of the insulating material 80. A metal material such as copper (Cu), sliver (Ag), gold (Au), aluminum (Al), magnesium (Mg), cobalt (Co), or permalloy (a nickel-iron alloy) may be employed as the conductive material for the support 10. In other examples, a material such as resin, plastic, ceramic, or silicon may be employed as an insulating material for the support 10.

The semiconductor chips 20 are accommodated in the recess of the support 10 and stacked in tiers on a bottom surface F10 of the support 10 (or a bottom of the recess 10c). The semiconductor chips 20 may be, for example, memory chips of a NAND flash memory or semiconductor chips on which arbitrarily selected LSIs are mounted. The semiconductor chips 20 may be of an identical configuration or different configurations. The semiconductor chips 20 are adhered to the bottom surface F10 and adhered to one another with the adhesive layers 30. Of each of the semiconductor chips 20, a surface F20 is an element formed surface on which semiconductor elements are formed. The surface F20 as the element formed surface faces the redistribution layer 50. A rear surface of the semiconductor chip 20 on an opposite side of the surface F20 is adhered to the bottom surface F10.

The adhesive layers 30 are interposed between the semiconductor chip 20 and the bottom surface F10 of the support 10 and between the semiconductor chips 20 so as to adhere the semiconductor chip 20 to the bottom surface F10 and stack the semiconductor chips 20 on each other. The adhesive layers 30 are made of, for example, die attach film (DAF) or die attach paste (DAP) composed of phenol, polyimide, polyamide, acryl, epoxy, p-phenylenebenzobisoxazole (PBO), silicone, benzocyclobutene resins, or mixture material or a composite material of such resins.

The columnar electrodes 40 extend from the respective semiconductor chips 20 toward an opening OP10 of the support 10 (or an opening of the recess 10c) so as to electrically connect the semiconductor chips 20 to the redistribution layer 50. The columnar electrodes 40 extend substantially vertically from the bottom surface F10 and the surface F20 of each of the semiconductor chips 20. One end of each of the columnar electrodes 40 is connected to an electrode pad P20 of the semiconductor chip 20, and the other end of the columnar electrode 40 is connected to wiring of the redistribution layer 50 or an electrode pad P50.

For example, the semiconductor chips 20 are stacked in tiers and displaced from one other. The columnar electrode 40 extends from the electrode pad P20 disposed on a tier end portion of each of the plurality of semiconductor chips 20. With this configuration, each of the semiconductor chips 20 is directly connected to the redistribution layer 50 via the corresponding columnar electrode 40 so as to directly transmit and receive a signal to and from an external or internal controller, for example, via the redistribution layer 50. This can consequently increase communication data amounts and communication speeds both between the semiconductor chips 20 and between the semiconductor chip 20 and the controller. The columnar electrode 40 may be, for example, a metal wire used for a bonding wire. The columnar electrode 40 may be made of, for example, a low-resistance metal such as Au, Ag, Cu, or copper-pallidum alloy (CuPd).

The redistribution layer 50 is disposed on the opening OP10 side of the support 10 to close the opening OP10. The redistribution layer 50 has a multi-layer wiring configuration with a plurality of interlayer insulating films 51 and a plurality of wiring layers 52 being stacked on each other. Each of the interlayer insulating films 51 is interposed between an adjacent pair of the wiring layers 52 and electrically insulates the wiring layers 52 from each other. A via contact 53 is disposed on the interlayer insulating film 51 between the wiring layers 52 as needed and electrically connects pieces of wiring of the wiring layers 52 to each other. An insulating material such as resin is used for the interlayer insulating films 51. A low-resistance metal such as copper and tungsten is used for the wiring layers 52 and the via contact 53, for example.

The redistribution layer 50 has a rear surface F50a, which faces the semiconductor chips 20 and the bottom surface F10 of the support 10, and a surface F50b, which faces the rear surface F50a. The columnar electrodes 40 are connected to the wiring layer 52 on the rear surface F50a side. The electrode pads 60 are disposed on the wiring layer 52 on the surface F50b side. The metal bumps 70 are disposed on the electrode pads 60.

The electrode pads 60 are disposed on part of the wiring layer 52 of the redistribution layer 50 so as to electrically connect the metal bumps 70 to the part of the wiring layer 52. A low-resistance metal such as copper and tungsten is used for the electrode pads 60, for example.

The metal bumps 70 are disposed on the electrode pads 60 so as to obtain electrical connection to other devices. A low-resistance metal such as solder is used for the metal bumps 70, for example.

The recess of the support 10 is filled with the insulating material 80 to cover and protect the semiconductor chips 20 and the columnar electrodes 40. The semiconductor chips 20 are not directly adhered to the redistribution layer 50. The insulating material 80 is interposed between the element formed surfaces F20 of the semiconductor chips 20 and the redistribution layer 50, and the columnar electrodes 40 electrically connect the semiconductor chips 20 and the redistribution layer 50 to each other.

The semiconductor chips 20 are stacked not on the redistribution layer 50 but on the bottom surface F10 of the support 10 (or the bottom of the recess 10c). An upper end of the opening OP10 of the support 10 (or the opening of the recess 10c) is at a higher level than the surface of the uppermost one of the semiconductor chips 20, and the insulating material 80 fully encapsulates the semiconductor chips 20 including the uppermost one in the recess 10*c*. The insulating material 80 is interposed between the semiconductor chips 20 and the redistribution layer 50. The insulating material 80 fills up a space surrounded by the support 10 and the redistribution layer 50 and is in contact with the redistribution layer 50.

In the semiconductor device 1 according to the present embodiment, the semiconductor chips 20 and the columnar electrodes 40 are accommodated in the recess of the support 10 composed of the bottom portion 10*a* and the side portion 10*b* and are encapsulated by the insulating material 80. The side portion 10*b* reduces momentum of a flow of the insulating material 80. Therefore, when the semiconductor chips 20 and the columnar electrodes 40 are encapsulated by the insulating material 80, the side portion 10*b* can prevent the insulating material 80 (such as molding resin) from forcibly flowing in the vicinity of and around the semiconductor chips 20 and the columnar electrodes 40 in the recess. Reducing the flow of the insulating material 80 prevents or effectively mitigates deformation of the columnar electrodes 40 so that positions of distal ends of the columnar electrodes 40 exposed from the insulating material 80 can be stabilized without deviation.

The support 10 is made of a material having a hardness different from a hardness of the cured insulating material 80. When the insulating material 80 is polished after being cured, the upper end of the side portion 10*b* of the support 10 functions as a polishing stopper. In one instance, the material of the support 10 may be made harder than the cured insulating material 80. In such a case, the side portion 10*b* of the support 10 can further properly function as the stopper in polishing the insulating material 80 and prevent excessive polishing. In another instance, the material of the support 10 may be softer than the cured insulating material 80. In such a case, the support 10 and the insulating material 80 have different polishing resistances so that a polishing apparatus can detect that the upper end of the side portion 10*b* of the support 10 is exposed. Therefore, insofar as the material of the support 10 has a hardness different from a hardness of the cured insulating material 80, the material of the support 10 may be harder or softer than the insulating material 80.

When the upper end of the side portion 10*b* is exposed, the polishing process is stopped to prevent the insulating material 80 from being left excessively unpolished or excessively polished so that a thickness of the insulating material 80 (or a resin thickness in the case where resin is used as the insulating material 80) in the semiconductor device 1 can be made substantially uniform, thereby preventing or substantially limiting warping of the package.

With the upper end of the side portion 10*b* of the support 10 serving as the stopper, the thickness of the insulating material 80 and the height from the bottom surface F10 to the upper end of the side portion 10*b* are self-aligned and made equal to each other. Therefore, there is no need to measure the thickness of the insulating material 80, thereby decreasing the throughput.

In the case where the support 10 is made of a material harder than the insulating material 80, the upper end of the side portion 10*b* protects the insulating material 80 in the vicinity of the upper end of the side portion 10*b* and prevents excessive polishing of the insulating material 80. Thus, the surface of the insulating material 80 can be prevented from being largely dished (for example, being recessed like a dish) so as to secure or improve flatness of the insulating material 80.

The side portion 10*b* of the support 10 reinforces the package of the semiconductor device 1 so that the side portion 10*b* can effectively minimize warping of the package.

In the case where the support 10 is made of a conductive material, the support 10 can produce a shield effect against electromagnetic noise or magnetic noise. For example, if the support 10 is made of a material such as Cu, Ag, Au, Al, and Mg, the support 10 has a function as an electromagnetic shield. For example, if the material of the support 10 is a magnetic material, such as permalloy or Co, the support 10 functions as a magnetic shield to cut low-frequency noise. If the support 10 is used as the electromagnetic shield or the magnetic shield, the support 10 is grounded via the redistribution layer 50.

FIGS. 2A to 6B depict an example of a manufacturing method of the semiconductor device 1 in a perspective view and a cross-sectional view according to the first embodiment. First, as shown in FIGS. 2A and 2B, the support 10 having a plurality of recesses are provided. The support 10 is not divided into pieces yet but is provided as a support substrate. The support 10 includes the bottom portion 10*a* and the side portions 10*b*. Each of the side portions 10*b* is thicker than the bottom portion 10*a*. The side portions 10*b* define recesses 10*c* in each of which the plurality of semiconductor chips 20 are stacked. In the present embodiment, the bottom portion 10*a* and the side portions 10*b* are integral to each other. Therefore, the recesses 10*c* may be formed by cutting a flat surface of the support 10 using, for example, lithography or etching. Alternatively, the recesses 10*c* may be formed by cutting the flat surface of the support 10 using, for example, laser processing. Each of the recesses 10*c* is a space surrounded by the bottom portion 10*a* and the side portions 10*b* and recessed to be deeper than an overall thickness of the stacked semiconductor chips 20 and adhesive layers 30.

For example, a thickness of each of the side portions 10*b* may be approximately 200 μm to approximately 1000 μm. A thickness of the bottom portion 10*a* may be approximately 30 μm to approximately 200 μm. When the thickness of the side portion 10*b* is less than approximately 200 μm, rigidity of the support 10 may be low such that the support 10 may warp after the recesses 10*c* are filled with the insulating material 80. When the thickness of the side portion 10*b* exceeds 1000 μm, it may be difficult to fill the recess 10*c* with the insulating material 80 such as molding resin. If the thickness of the bottom portion 10*a* is less than 30 μm, it may be difficult to stack the semiconductor chips 20 on the bottom surface F10 and to retain the stacked semiconductor chips 20. If the thickness of the bottom portion 10*a* exceeds 200 μm, while warping of the support 10 after being filled with the insulating material 80 decreases, a package thickness of the semiconductor device 1 increases. Therefore, in one instance, the side portions 10*b* and the bottom portion 10*a* of the support 10 are maintained in the above-described thickness ranges.

A width of each of the side portions 10*b* (that is an interval between an adjacent pair of the recesses 10*c*) may be 0.1 mm or greater. If the width is less than 0.1 mm, mechanical strength of the side portion 10*b* may be insufficient, and warping of the support 10 after being filled with the insulating material 80 may still occur. If the width is 0.1 mm or greater, the mechanical strength of the side portion 10*b* can be enhanced to prevent or minimize warping of the support 10 after being filled with the insulating material 80.

Next, as shown in FIGS. 2A and 2B, the plurality of semiconductor chips 20 are stacked on the bottom surface F10 in each of the recesses 10c. The adhesive layer 30 is adhered to a rear surface of each of the semiconductor chips 20 in advance. When the semiconductor chip 20 is placed on the bottom surface F10 or another of the semiconductor chips 20, the adhesive layer 30 adheres the semiconductor chip 20 to the bottom surface F10 or another of the semiconductor chips 20. At this time, the semiconductor chips 20 are stacked in tiers in a vertical direction from the bottom surface F10 and displaced from one another in a direction parallel to the bottom surface F10 to expose the respective electrode pads P20 as shown in FIG. 1.

Each of the columnar electrodes 40 is then extended from the electrode pad P20 of each of the semiconductor chips 20 toward the opening OP10 in the recess 10c. The columnar electrode 40 is, for example, a metal wire. A wire bonder connects one end of the metal wire to the electrode pad P20 by wire bonding or substantially the same method as wire bonding, for example. The wire bonder draws the metal wire above the opening OP10 (or higher than the upper end of the side portion 10b) in a direction substantially perpendicular to the bottom surface F10 or the exposed surface of the semiconductor chip 20. The wire bonder then cuts the metal wire. Thus, the other end of the metal wire is positioned above the opening OP10. For example, the columnar electrode 40 extends substantially vertically from the electrode pad P20 of each of the semiconductor chips 20 toward the opening OP10, and an upper end of the columnar electrode 40 is located at a position higher than the opening OP10. The metal wire of the columnar electrode 40 is, for example, a thin metal wire having a diameter of approximately 10 μm to 100 μm. A height from the bottom surface F10 to the opening OP10 (that is a thickness of the side portion 10b or a depth of the recess 10c) may be relatively low, for example in the range of approximately 30 μm to 1000 μm, so that the metal wire can be kept upright in the recess 10c.

Figures 3A, 3B:
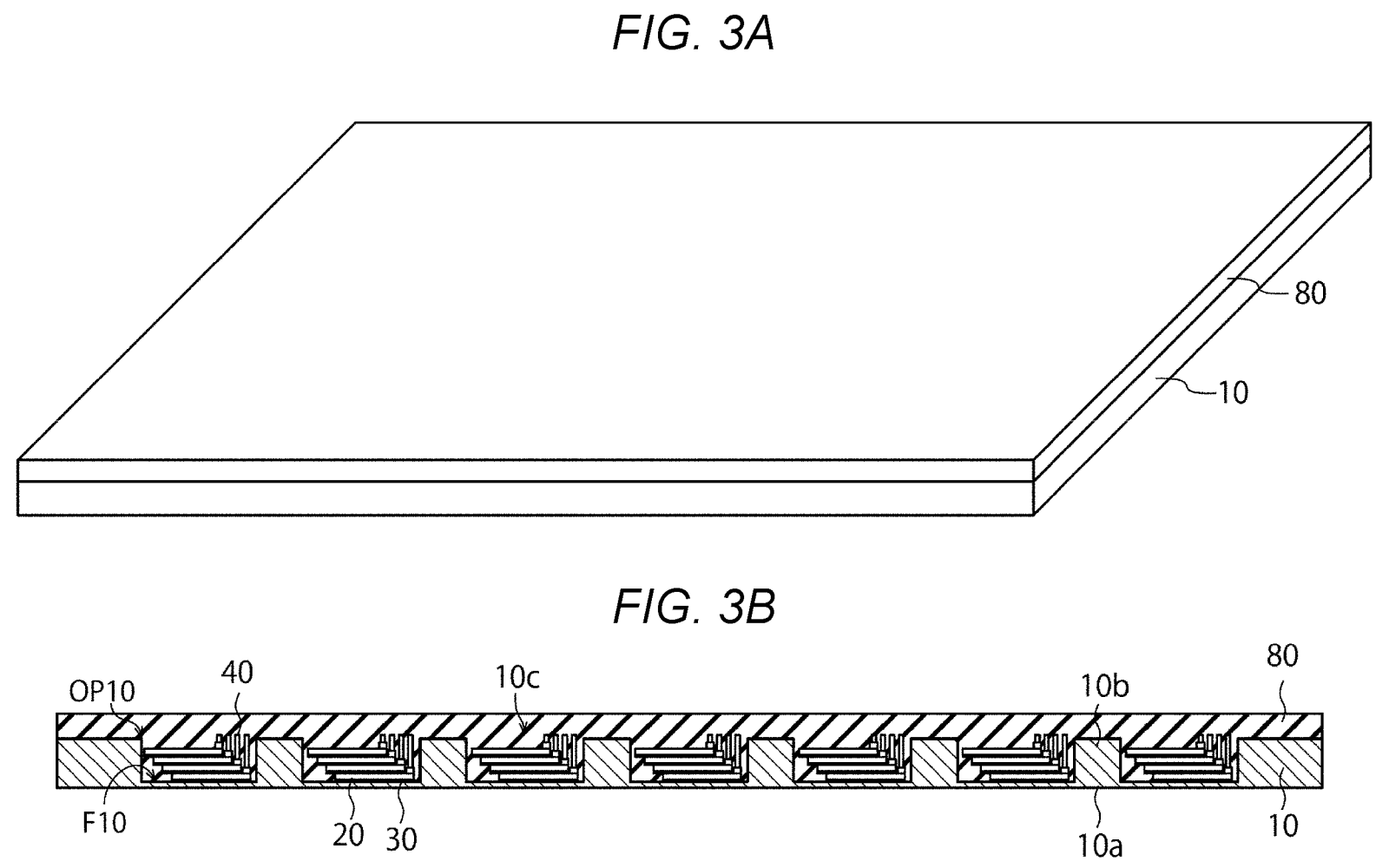

Subsequently, as shown in FIGS. 3A and 3B, the insulating material 80 is provided into each of the recesses 10c so as to cover the semiconductor chips 20 and the columnar electrodes 40 therewith. The insulating material 80 is, for example, resin and is over-molded above the opening OP10 in each of the recesses 10c (or higher than the upper end of the side portion 10b) and above an upper end of each of the columnar electrodes 40. Thus, the semiconductor chips 20 and the columnar electrodes 40 are wholly buried in the insulating material 80.

At this time, the semiconductor chips 20 and the columnar electrodes 40 are disposed in each of the recesses 10c and surrounded by the side portions 10b on four sides. Consequently, when the insulating material 80 in a molten state is poured into each of the recesses 10c, a flow of the molten insulating material 80 is blocked by the side portions 10b at least to some extent. This configuration prevents the columnar electrodes 40 from falling down. In one instance, each of the side portions 10b functions to protect the columnar electrodes 40 and the semiconductor chips 20 from the flow of the molten insulating material 80.

The provision of the insulating material 80 (or filling of the recess 10c with the insulating material 80) may be done by, for example, molding or sheet molding using a sheet film. Alternatively, it may be done by applying liquid resin. Afterward, the insulating material 80 is cured and hardened using, for example, ultraviolet radiation.

Figures 4A, 4B:
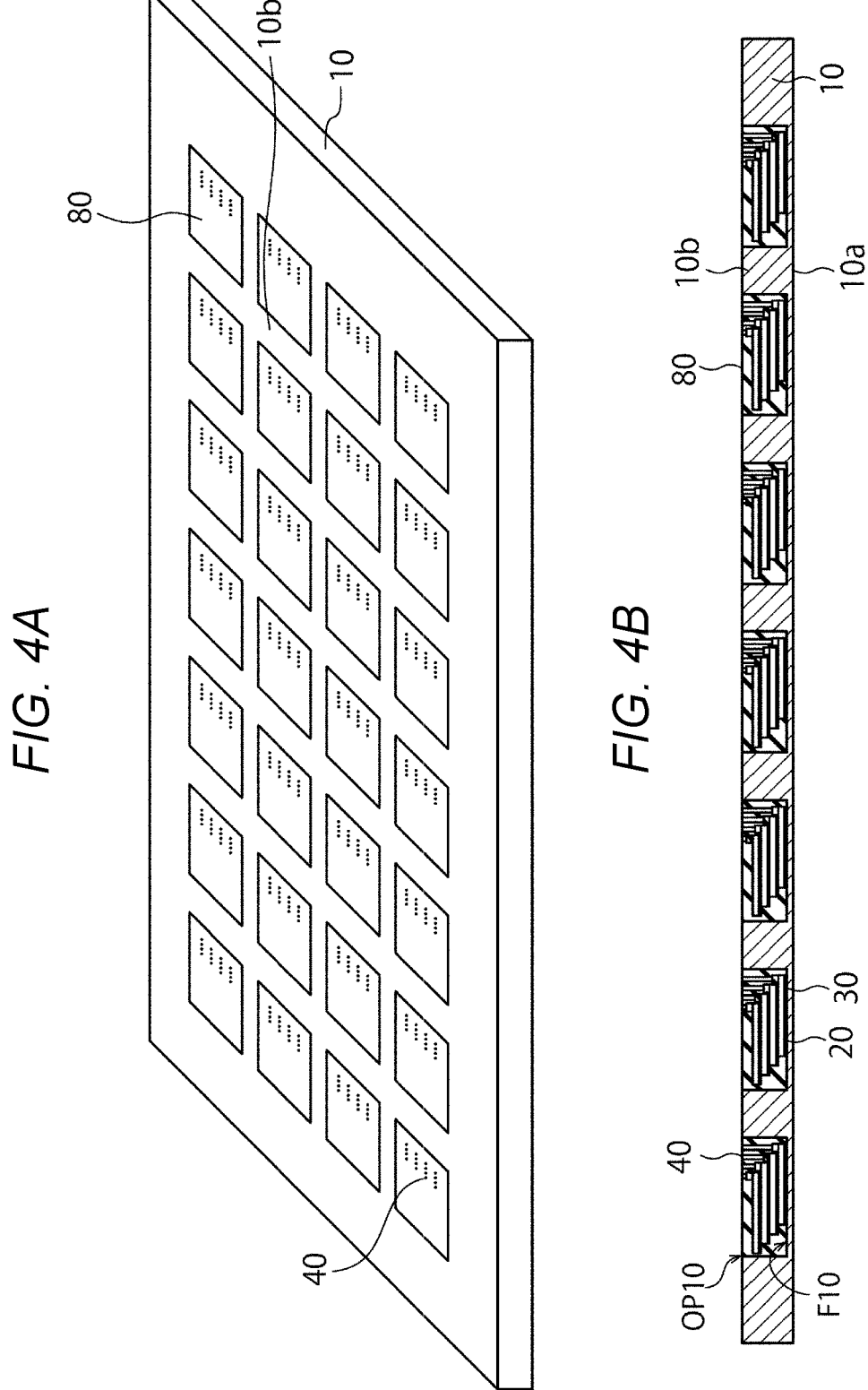
FIG. 4A depicts an example of a manufacturing method of a semiconductor device in a perspective view according to a first embodiment.
FIG. 4B depicts an example of a manufacturing method of a semiconductor device in a cross-sectional view according to a first embodiment.

As shown in FIGS. 4A and 4B, the insulating material 80 is then polished until the surface of each of the side portions 10b and the upper end of each of the columnar electrodes 40 are exposed. Polishing may be, for example, chemical mechanical polishing (CMP). Since the upper end of each of the columnar electrodes 40 is located at a higher level than the upper end of each of the side portions 10b, as the polishing of the insulating material 80 advances, the upper end of each of the columnar electrodes 40 is first exposed, and thereafter the upper end or the surface of each of the side portions 10b is exposed.

The upper end of each of the side portions 10b is located at a higher level than the stacked semiconductor chips 20. Therefore, the polishing is stopped when the upper end or the surface of each of the side portions 10b is exposed so that the insulating material 80 remains on the uppermost one of the semiconductor chips 20. Thus, the semiconductor chips 20 remain covered with the insulating material 80 whereas the upper ends of the columnar electrodes 40 and side portions 10b are exposed.

In this case, because the columnar electrodes 40 are made of a thin metal wire, it is difficult for the polishing apparatus in a polishing process to detect that the columnar electrodes 40 have been exposed. However, the side portions 10b extend over a relatively wide range. Consequently, when the side portions 10b are exposed, polishing resistance changes noticeably so that the polishing apparatus or the like can relatively easily and properly detect that the side portions 10b have been exposed by monitoring changes in the polishing resistance. In the case of the side portions 10b being made of a material harder than the insulating material 80, a polishing speed decreases when the side portions 10b are exposed. Thus, each of the side portions 10b functions as a polishing stopper more effectively. When the side portions 10b are made of a material softer than the insulating material 80, the polishing speed does not decrease. However, because the polishing resistance decreases when the side portions 10b are exposed, each of the side portions 10b can still function as the polishing stopper even if the side portions 10b are softer than the insulating material 80.

Figures 5A, 5B:
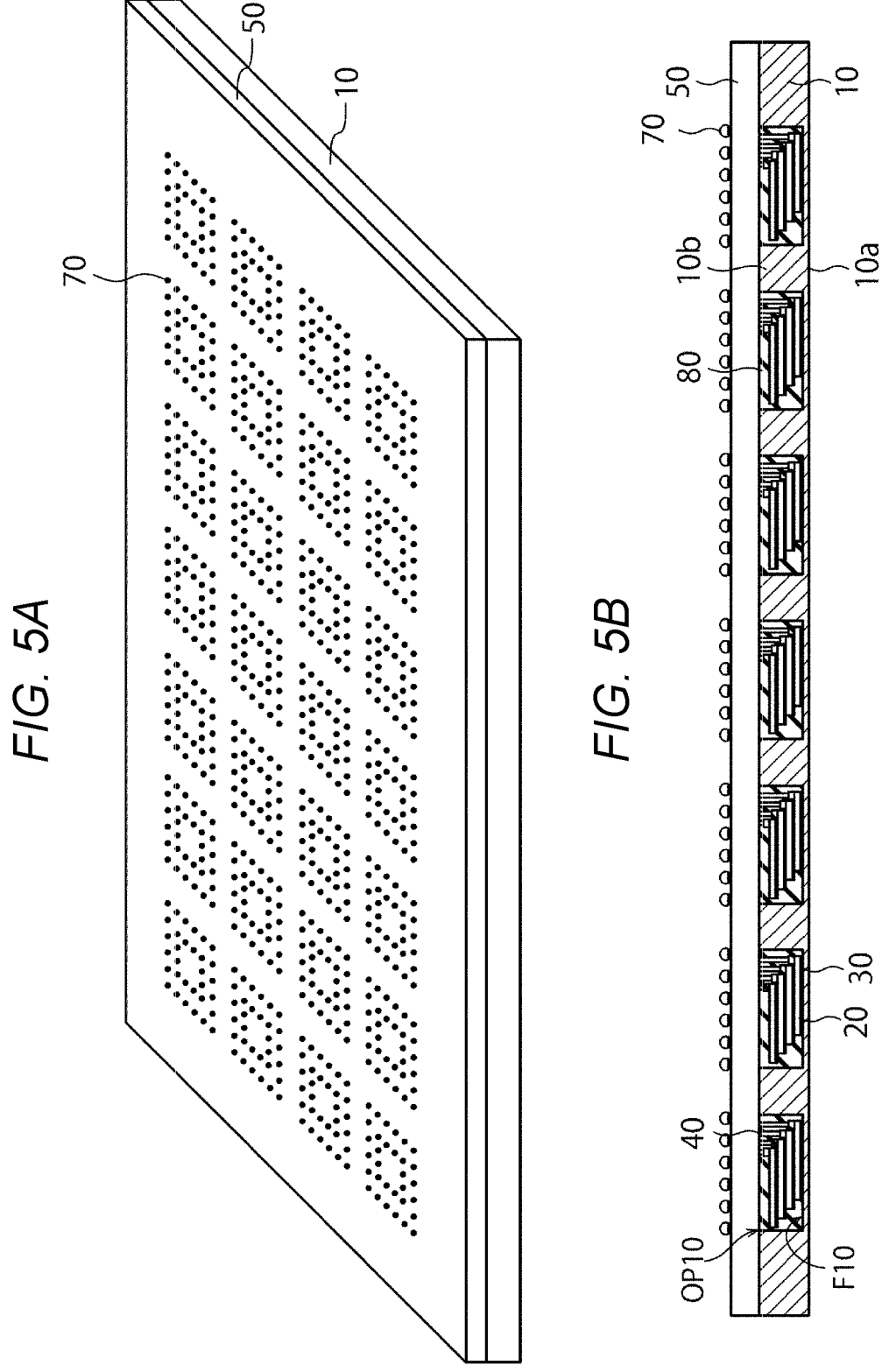
FIG. 5A depicts an example of a manufacturing method of a semiconductor device in a perspective view according to a first embodiment.
FIG. 5B depicts an example of a manufacturing method of a semiconductor device in a cross-sectional view according to a first embodiment.

Next, as shown in FIGS. 5A and 5B, the redistribution layer 50 is formed on the exposed columnar electrodes 40, the exposed side portions 10b, and the insulating material 80. The redistribution layer 50 is formed by stacking the wiring layers 52 (see FIG. 1), which are electrically connected to the columnar electrodes 40 and the side portions 10b, and the interlayer insulating layers 51 that insulate the wiring layers 52 from one another. Some of the wiring layers 52 are electrically connected to the columnar electrodes 40. Some other of the wiring layers 52 are also electrically connected to the side portions 10b so as to produce an electromagnetic shield effect or a magnetic shield effect of the support 10, which is conductive.

As shown in FIGS. 5A and 5B, metal bumps 70 (such as solder balls) are then formed on the redistribution layer 50. A heat treatment is performed to reflow to connect the metal bumps 70 to the electrode pads 60 (see FIG. 1) of the redistribution layer 50.

Figures 6A, 6B:
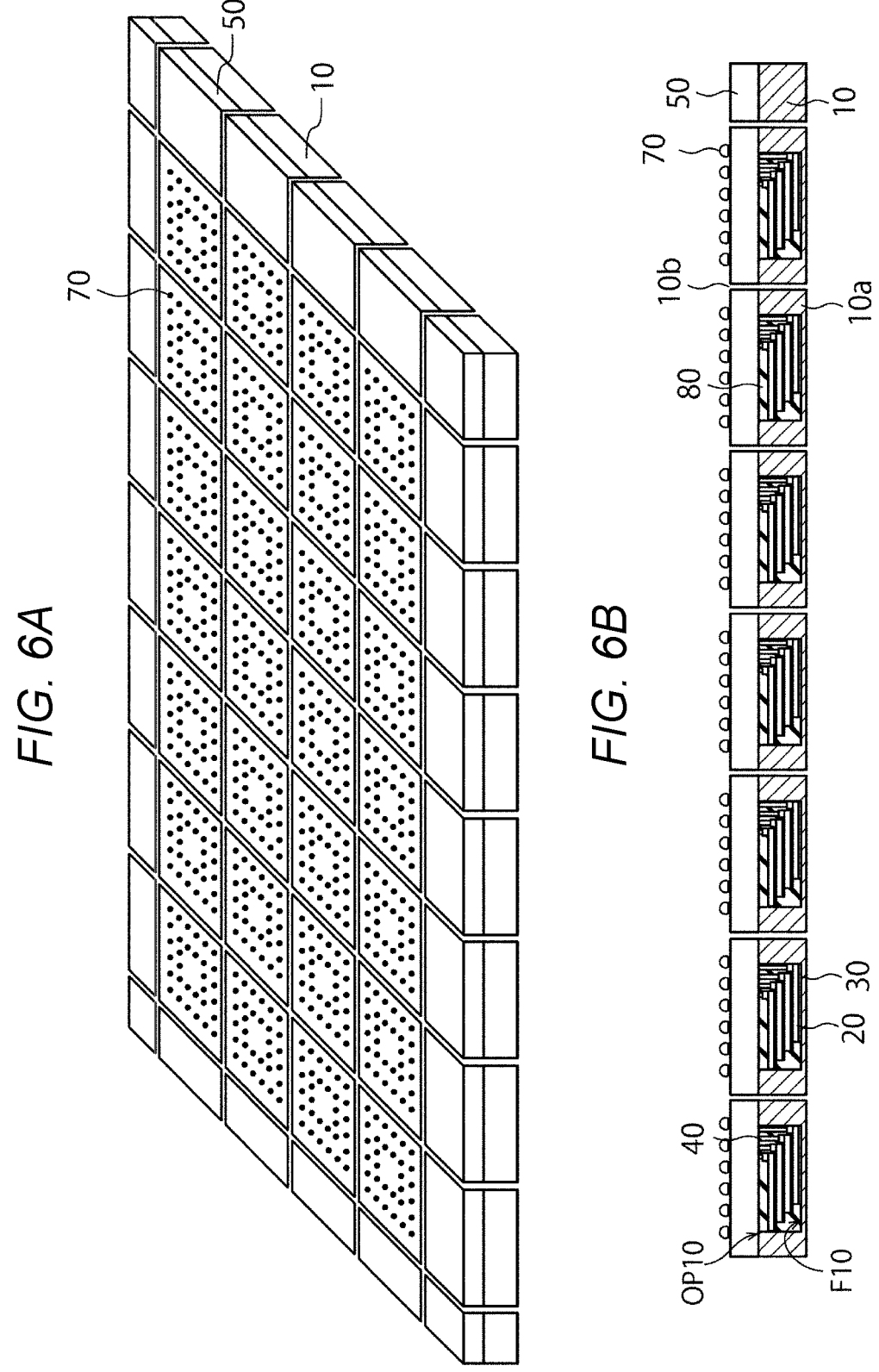
FIG. 6A depicts an example of a manufacturing method of a semiconductor device in a perspective view according to a first embodiment.
FIG. 6B depicts an example of a manufacturing method of a semiconductor device in a cross-sectional view according to a first embodiment.

As shown in FIGS. 6A and 6B, the side portions 10b of the support 10 are cut to obtain the semiconductor devices 1 individually divided. The side portions 10b are cut by, for example, a dicing technique such as a dicing blade and dicing laser. A center portion of each of the side portions 10b is cut in such a manner that the bottom portion 10a and the side portion 10b remain in each package of the diced semiconductor device 1. Consequently, as shown in FIG. 1, the support 1 can accommodate the plurality of semiconductor chips 20 in the recess formed by the bottom portion 10*a* and the side portion 10*b*. Thus, packaging of the semiconductor device 1 according to the present embodiment is completed.

According to the first embodiment, in encapsulating the semiconductor chips 20 and the columnar electrodes 40 by the insulating material 80, the side portion 10*b* of the support 10 surrounds the semiconductor chips 20 and the columnar electrodes 40. This configuration can prevent the molten insulating material 80 from making the columnar electrodes 40 fall down or bending the columnar electrodes 40. As a result, before and after the provision of the insulating material 80, positions of distal ends of the columnar electrodes 40 exposed from the insulating material 80 do not substantively change and stays stable. This facilitates connection between the wiring layers 52 and the columnar electrodes 40 in forming the redistribution layer 50.

In the case where the material of the support 10 has a hardness different from a hardness of the cured insulating material 80, in the polishing process of the insulating material 80, the upper end of the side portion 10*b* of the support 10 functions as the polishing stopper. Insofar as the material of the support 10 changes the polishing resistance of the insulating material 80, the material of the support 10 may be harder or softer than the insulating material 80. This can prevent the insulating material 80 from remaining excessively unpolished and excessively polished and can make the thickness of the insulating material 80 (for example, the resin thickness) substantially uniform, thus minimizing warping of the package.

In the case where the upper end of the side portion 10*b* of the support 10 is used as the stopper, the thickness of the insulating material 80 and the height from the bottom surface F10 of the support 10 to the upper end of the side portion 10*b* are self-aligned and made equal to each other. Thus, there is no need to measure the thickness of the insulating material 80, thereby there is no decreasing of the throughput.

Because the side portion 10*b* is disposed around the semiconductor chips 20 and because the side portion 10*b* can be made of a material harder than the insulating material 80 as one example in the first embodiment, the polishing surface of the insulating material 80 can be prevented from being dished (or being recessed like a dish) so that flatness of the insulating material 80 can be further improved. This facilitates forming of the redistribution layer 50 on the insulating material 80. The side portion 10*b* of the support 10 can also reinforce the package of the semiconductor device 1 and prevent or minimize warping of the package.

Moreover, because a conductive material can be used for the support 10, the support 10 can provide a shielding effect against electromagnetic noise or magnetic noise. In such a case, the support 10 is grounded via the redistribution layer 50.

While in one instance, the columnar electrodes 40 are formed by wire bonding after stacking the semiconductor chips 20, in another instance, the columnar electrodes 40 may be formed on the semiconductor chips 20 in advance by wire bonding or plating, and thereafter, the semiconductor chips 20 may be stacked in the support 10.

Modification

Figure 7:
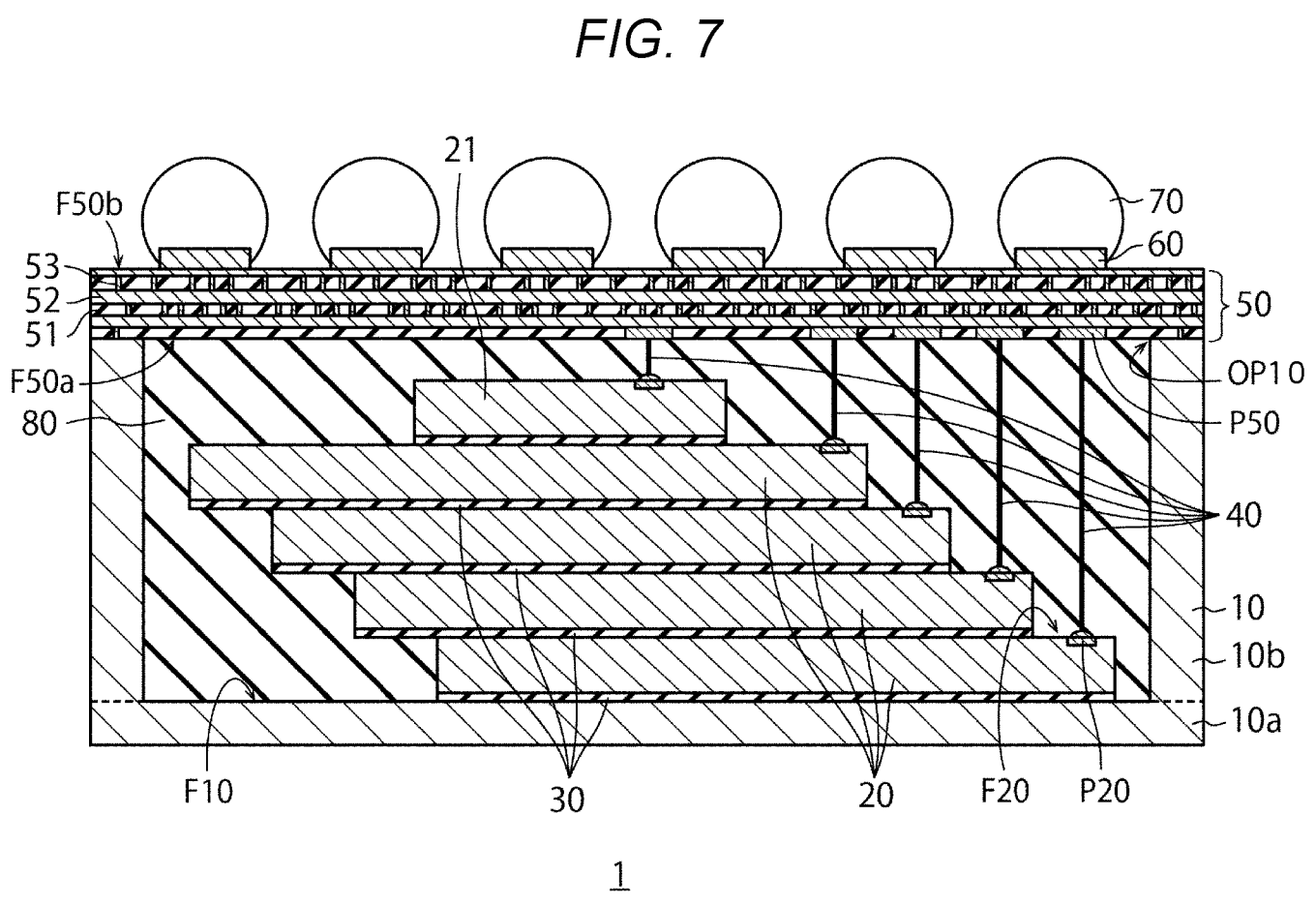

FIG. 7 depicts an example configuration of the semiconductor device 1 in a cross-sectional view according to one modification of the first embodiment. While in the first embodiment, the semiconductor chips 20 may be, for example, NAND memory chips of an identical configuration, some of the semiconductor chips 20 may have a different configuration, a different size, or function. For example, a semiconductor chip 21 in FIG. 7 is a controller chip used to control the semiconductor chips 20 (e.g., NAND memory chips). The semiconductor chip 21 is disposed on the stacked semiconductor chips 20 and is an uppermost one of the semiconductor chips accommodated in the recess of the support 10. The semiconductor chip 21 is likewise electrically connected to the redistribution layer 50 via the columnar electrode 40. In this manner, even in the case of including the different semiconductor chip 21, the same or substantially the same effects as those of the first embodiment can be achieved.

Second Embodiment

Figure 8:
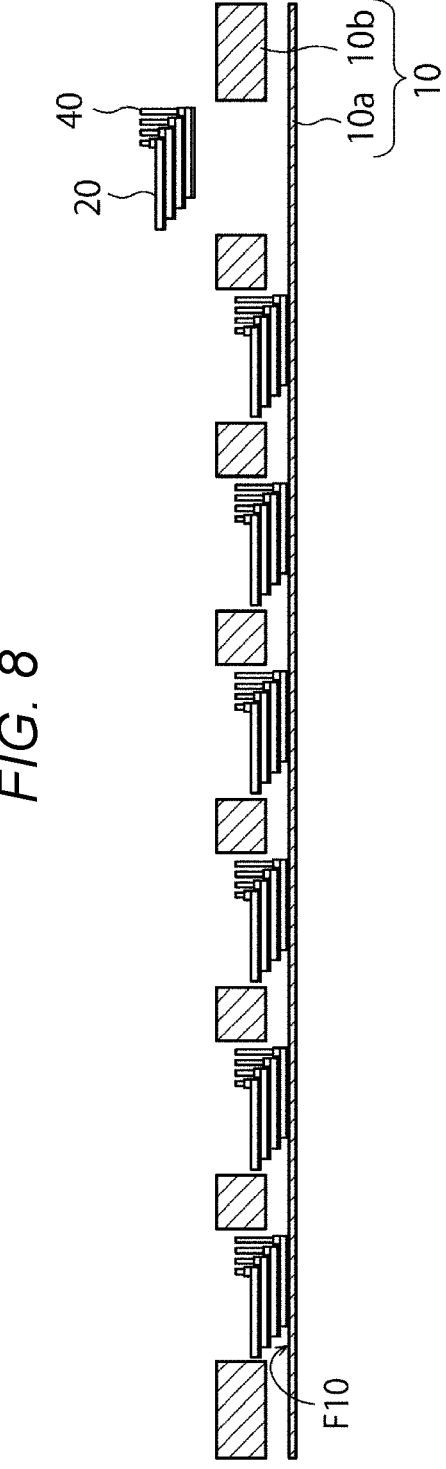
FIG. 8 depicts an example configuration of a support in a cross-sectional view according to a second embodiment.

FIG. 8 depicts an example configuration of the support 10 in a cross-sectional view according to a second embodiment. The support 10 according to the second embodiment includes the bottom portion 10*a* and the side portions 10*b* that are provided as separate components. The bottom portion 10*a* and the side portions 10*b* may be made of the same material as the support 10 of the first embodiment. The bottom portion 10*a* and the side portions 10*b* may be made of an identical material or different materials from each other. For example, a resin material may be used for the bottom portion 10*a*, and a metal material may be used for the side portions 10*b*. Conversely, a metal material may be used for the bottom portion 10*a*, and a resin material may be used for the side portions 10*b*.

Each of the side portions 10*b* is adhered to the bottom portion 10*a* with an adhesive layer (not separately depicted). The semiconductor chips 20 are mounted on the bottom portion 10*a*. The semiconductor chips 20 may be stacked on the bottom surface F10 after the side portions 10*b* are adhered to the bottom portion 10*a*. Alternatively, the semiconductor chips 20 may be stacked on the bottom surface F10 before the side portions 10*b* are adhered to the bottom portion 10*a*. In the latter case, the adhering process of the side portions 10*b* is performed without interfering the stacked semiconductor chips 20.

Since the bottom portion 10*a* and the side portions 10*b* are separate components in the second embodiment, the bottom portion 10*a* and the side portions 10*b* can be formed individually. In this case, the bottom portion 10*a* may be made of a plate-shaped material. The side portions 10*b* may be obtained by opening holes at predetermined positions in a plate-shaped material by, for example, presswork. Thereafter, the side portions 10*b* are adhered onto the bottom portion 10*a*. Since there is no need to use lithography, etching, or laser processing, the support 10 according to the second embodiment can be formed more easily than the case where the bottom portion 10*a* and the side portions 10*b* are integral to each other.

The rest of the configuration of the second embodiment may be the same or substantially the same as that of the first embodiment. The second embodiment can achieve the same or substantially the same effects as the first embodiment.

Third Embodiment

FIGS. 9A to 13B depict an example of the manufacturing method of the semiconductor device 1 in a perspective view and a cross-sectional view according to a third embodiment. In the third embodiment, the columnar electrodes 40 are formed not by wire bonding but by plating, for example, after forming the insulating material 80.

Figures 9A, 9B:
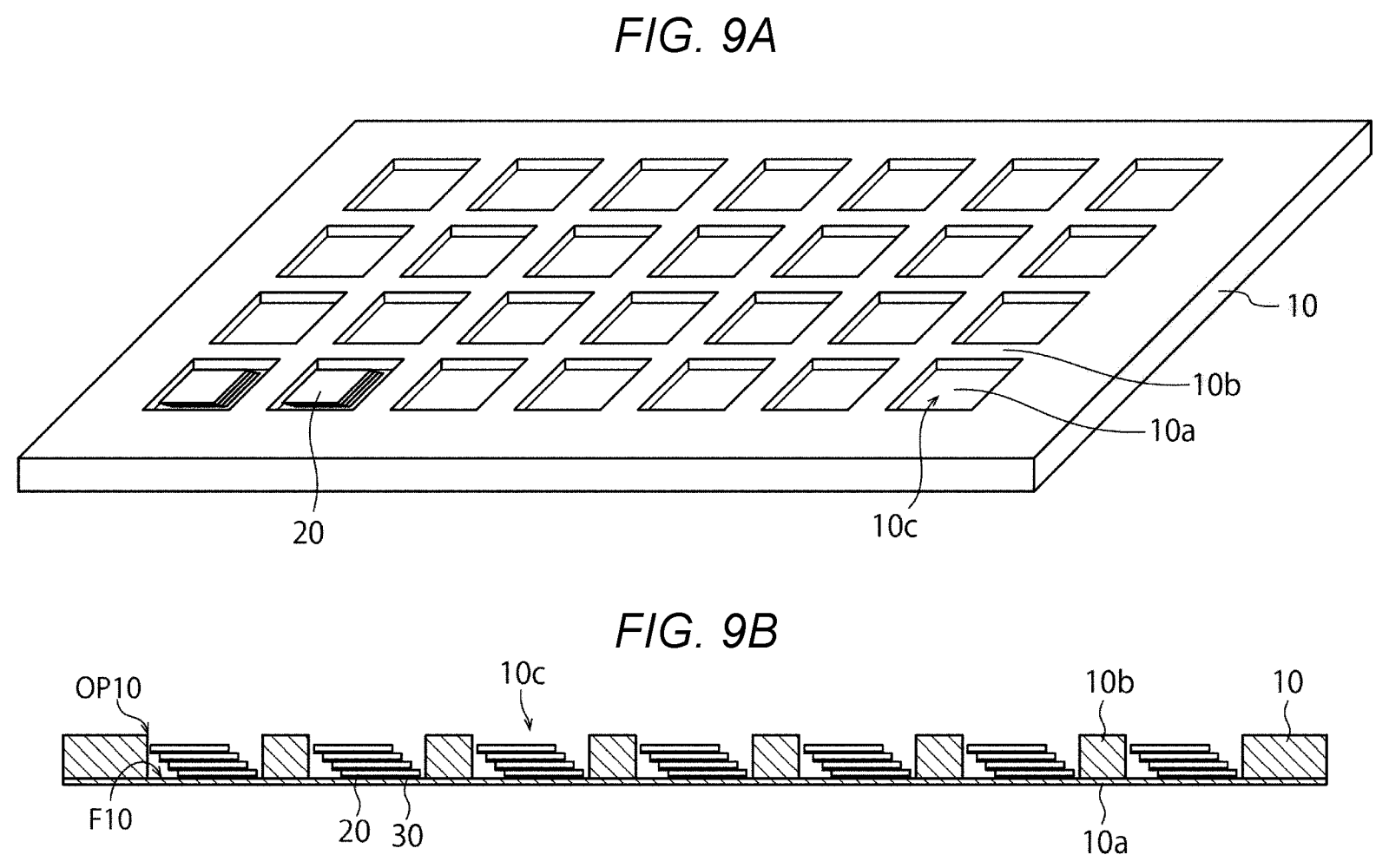

First, as shown in FIGS. 9A and 9B, the plurality of semiconductor chips 20 are stacked on the bottom surface F10 in each of the recesses 10c. The semiconductor chips 20 may be stacked by the same or substantially the same method as that used in the first embodiment. At this time, the columnar electrodes 40 are not formed yet.

Figures 10A, 10B:
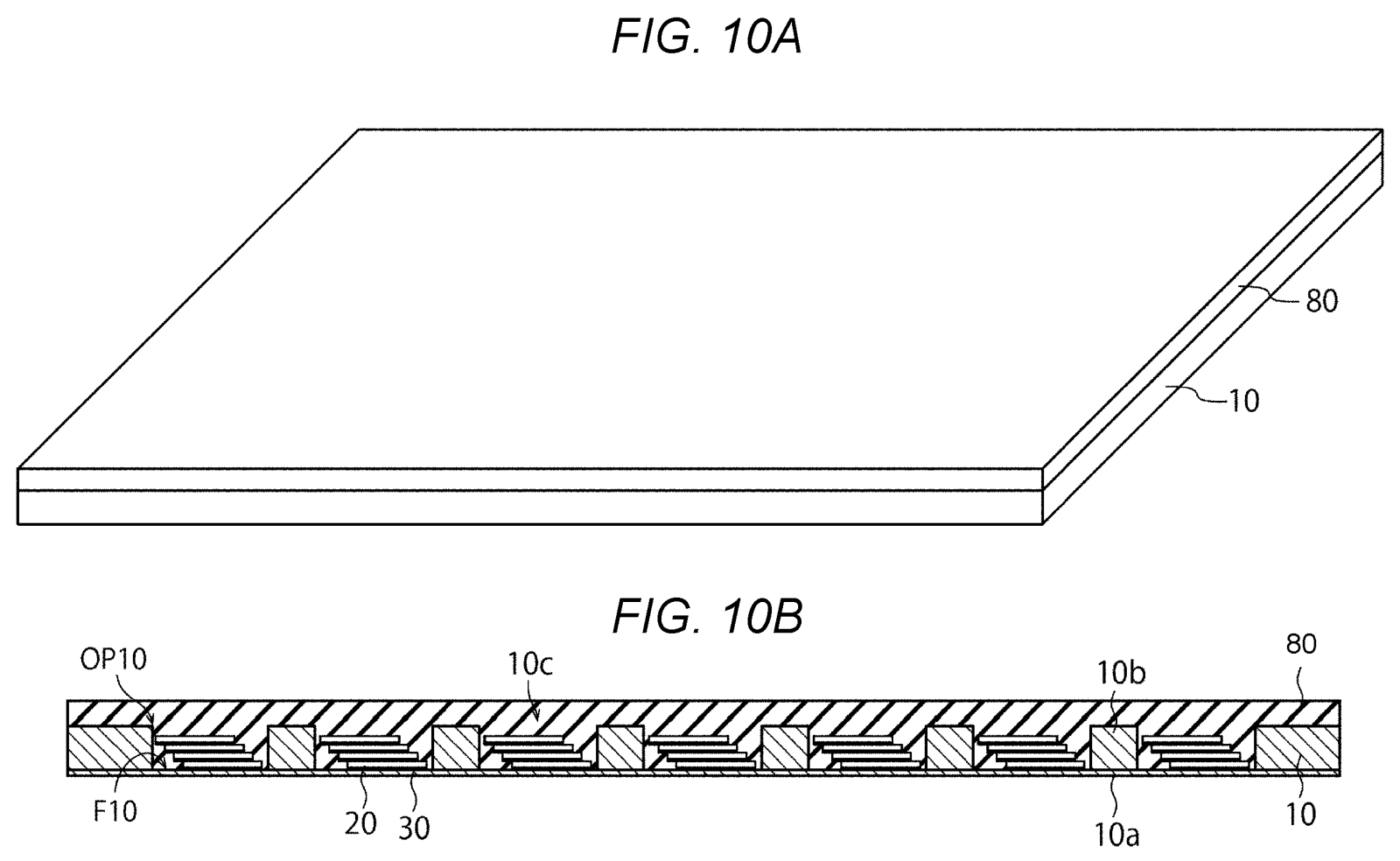

Next, as shown in FIGS. 10A and 10B, the insulating material 80 is provided or poured into each of the recesses 10c so as to cover the semiconductor chips 20 therewith. This may be done by the same or substantially the same method as that used in the first embodiment.

Figures 11A, 11B:
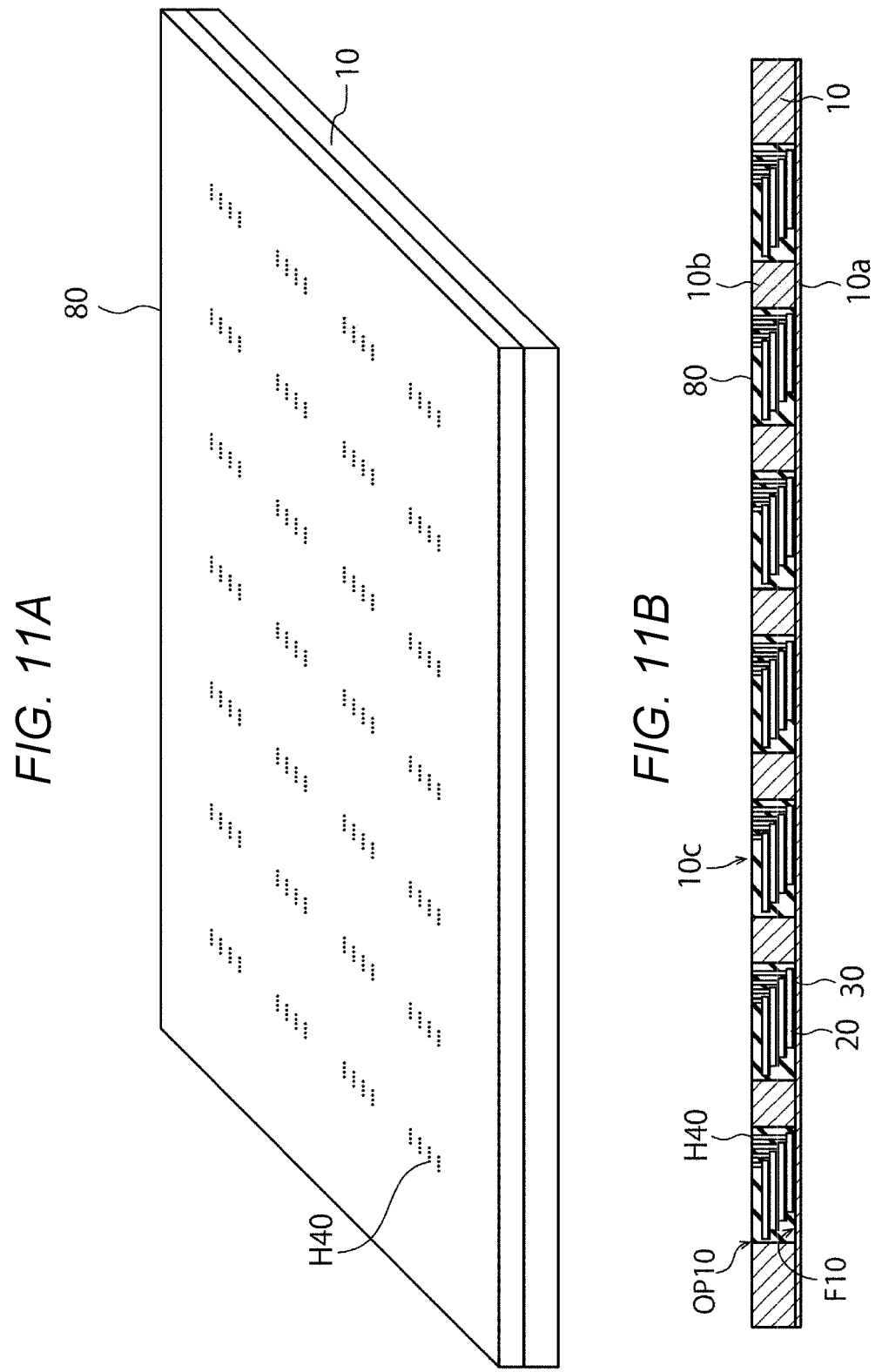
FIG. 11A depicts an example of a manufacturing method of a semiconductor device in a perspective view according to a third embodiment.
FIG. 11B depicts an example of a manufacturing method of a semiconductor device in a cross-sectional view according to a third embodiment.

Then, as shown in FIGS. 11A and 11B, holes H40 are bored in the insulating material 80. The holes H40 may be formed by laser, for example. The holes H40 are formed at positions where the columnar electrodes 40 are to be formed. The holes H40 extend to the electrode pads p20 of the semiconductor chips 20.

Figures 12A, 12B:
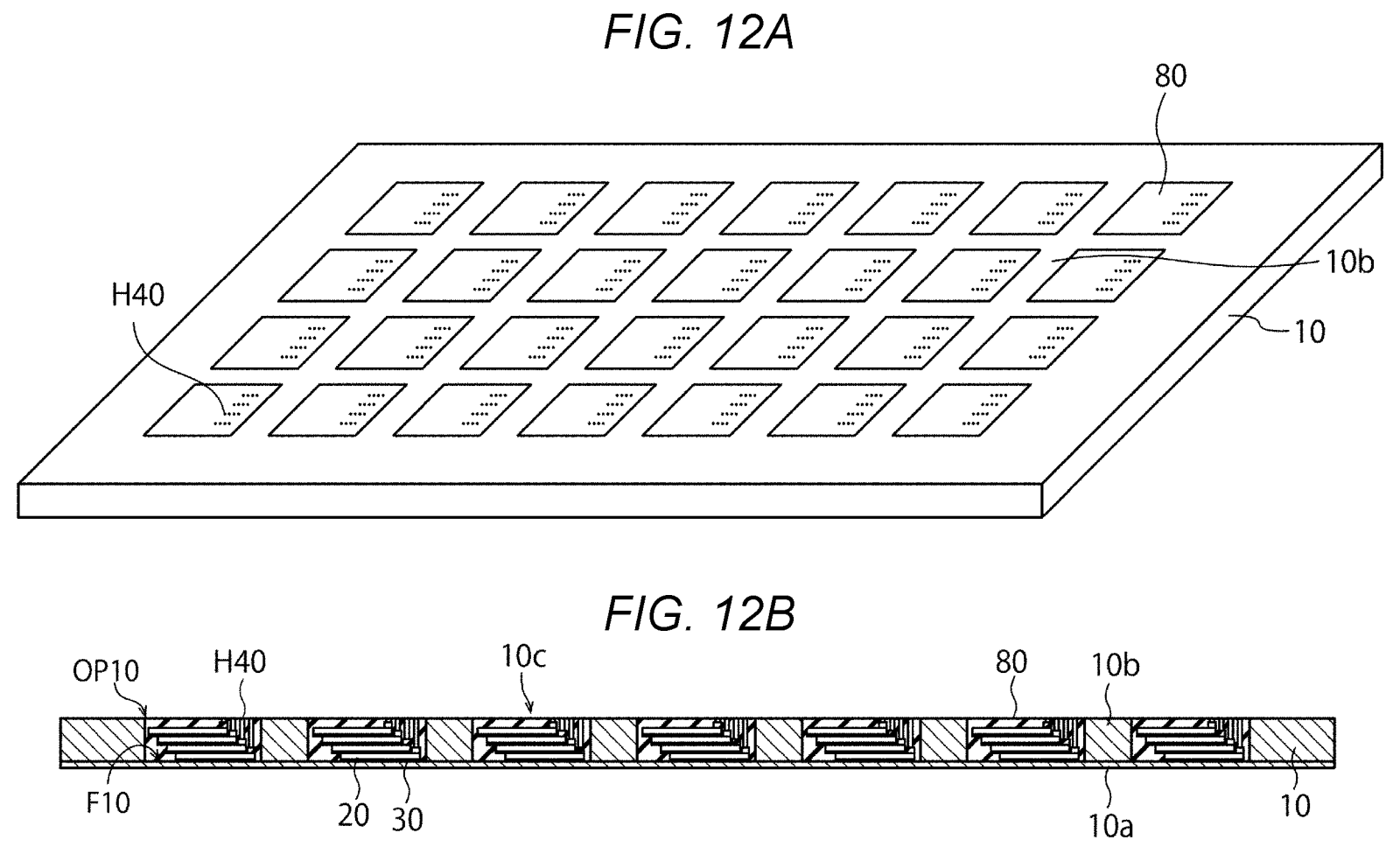

As shown in FIGS. 12A and 12B, with each of the side portions 10b serving as the stopper, the insulating material 80 is polished. The insulating material 80 may be polished by the same or substantially the same method as that used in the first embodiment. This polishing process make the surface of each of the side portions 10b exposed.

Figures 13A, 13B:
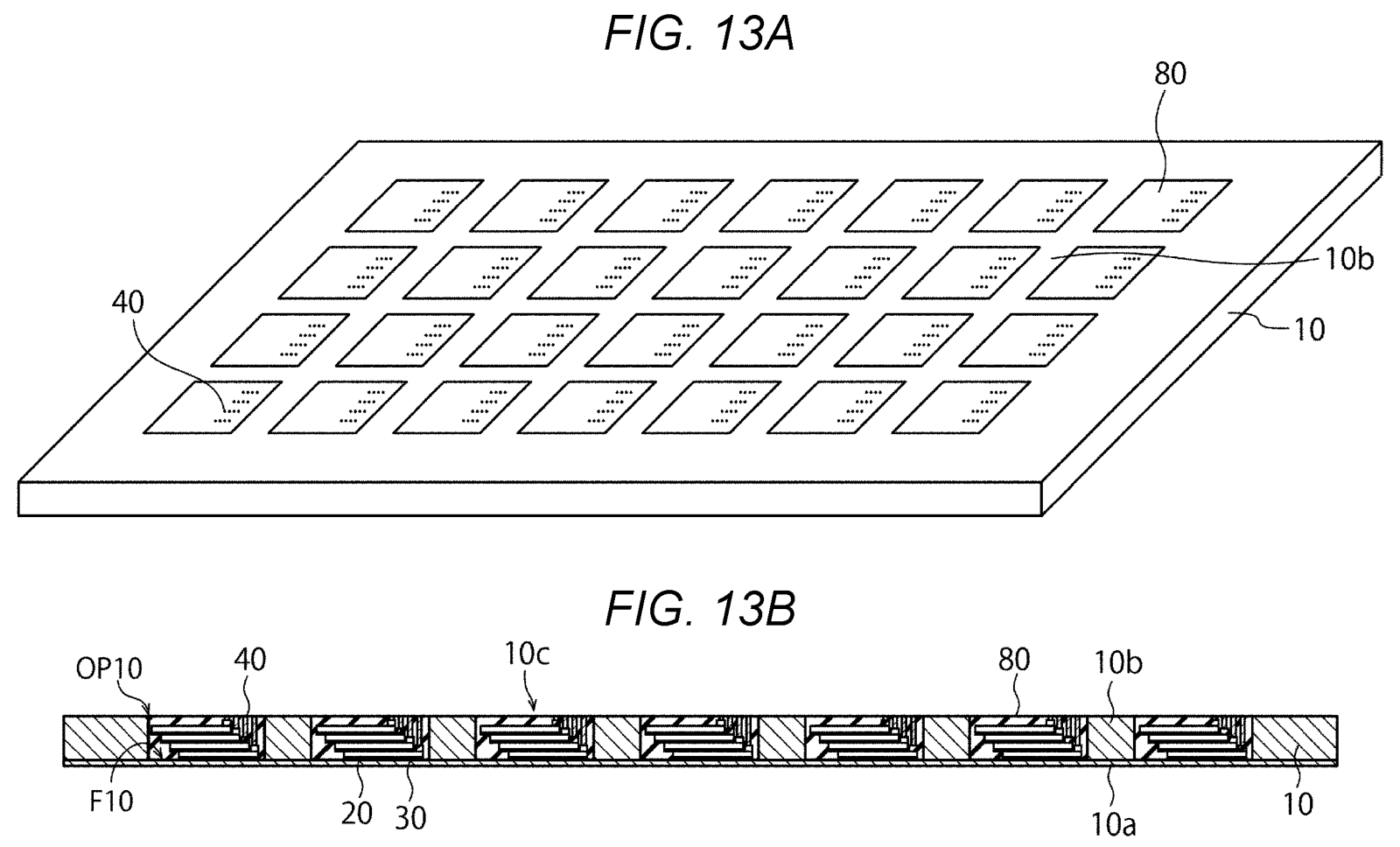

Subsequently, as shown in FIGS. 13A and 13B, a metal material is inserted in the holes H40 so as to form the columnar electrodes 40. The columnar electrodes 40 may be formed by plating, for example. The columnar electrodes 40 extend from the electrode pads P20 of the semiconductor chips 20 to the surface of the insulating material 80.

Then, the processes described with reference to FIGS. 5A to 6B complete the packaging of the semiconductor device 1.

As in other embodiments, the columnar electrodes 40 can be formed by plating instead of wiring bonding. In the third embodiment, because the columnar electrodes 40 are formed after the insulating material 80 is provided into each of the recesses 10c, a flow of the insulating material 80 will not make the columnar electrodes 40 fall down or bend. Therefore, positions of distal ends of the columnar electrodes 40 are more stable than those of the columnar electrodes 40 formed according to the first embodiment.

Modifications

Figure 14:
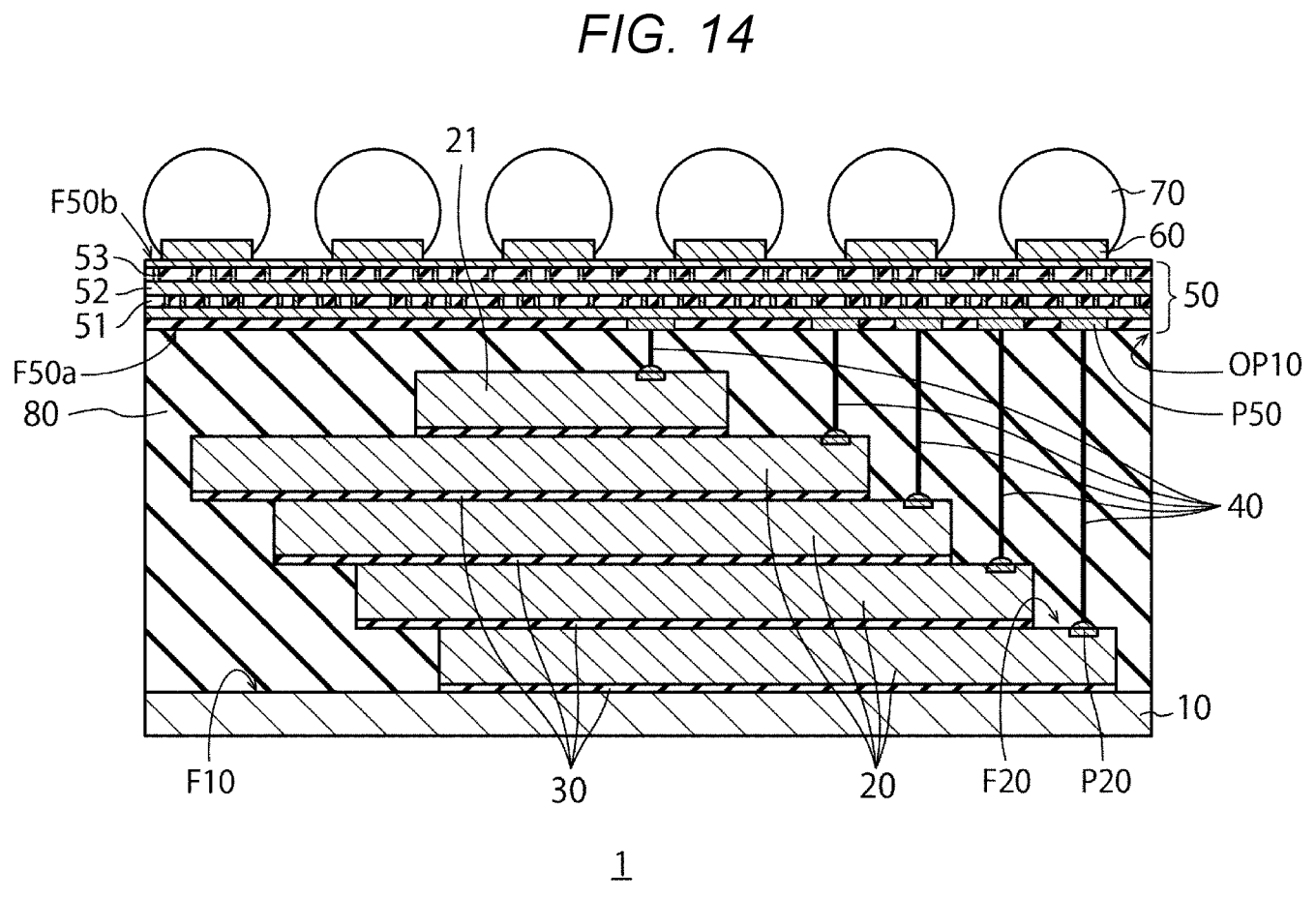
Figure 15:
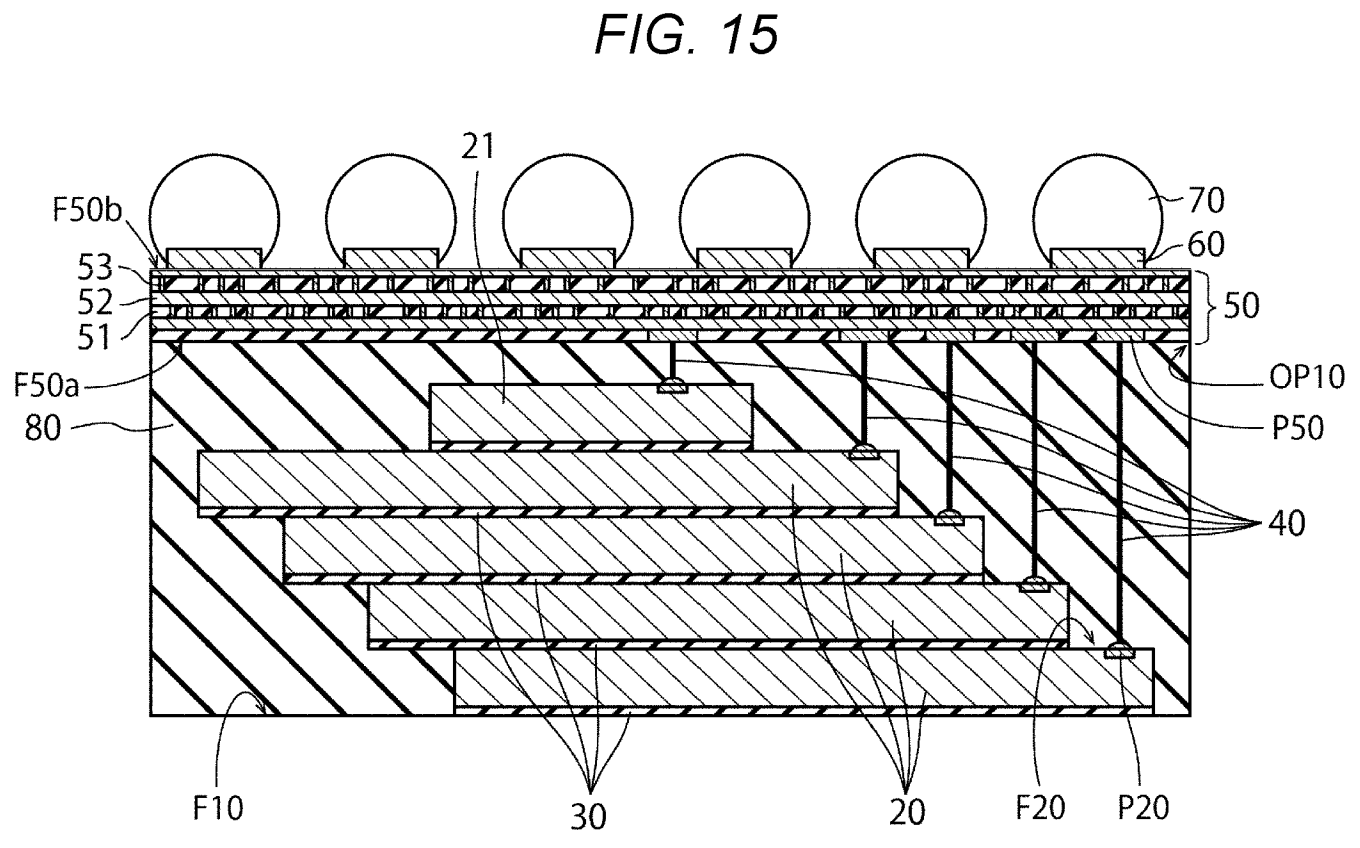

Each of FIGS. 14 and 15 depicts an example configuration of the semiconductor device 1 according to some modifications of the first embodiment.

In the modified embodiment shown in FIG. 14, when the support 10 is divided into the plurality of semiconductor devices 1, a boundary portion between each of the side portions 10b and the insulating material 80 or a portion on the insulating material 80 side of the boundary portion is cut using, for example, a dicing technique such as a dicing blade and dicing laser. Consequently, the side portion 10b does not remain at side surfaces of the semiconductor device 1, and the insulating material 80 is exposed. The insulating material 80 remains on side surfaces of the semiconductor chips 20 and does not expose the semiconductor chips 20. In this manner, the side portions 10b may be removed at the time of dicing. This can reduce the package of the semiconductor device 1 in size. The rest of the configuration and a manufacturing method of this modified embodiment may be the same or substantially the same as in the first to third embodiments.

In the modified embodiment shown in FIG. 15, the bottom portion 10a of the semiconductor device 1 is further removed. In this case, before the support 10 is diced, the bottom portion 10a of the support 10 is polished by, for example, CMP and removed such that the bottom portion 10a does not remain on the semiconductor devices 1 and the rear surface of the semiconductor chip 20 is exposed. Thereafter, the support 10 is divided into the plurality of semiconductor devices 1 using, for example, a dicing technique such as a dicing blade and/or dicing laser.

Upon dicing, a boundary portion between each of the side portions 10b and the insulating material 80 or a portion on the insulating material 80 side of the boundary portion is cut. Consequently, the side portions 10b do not remain at side surfaces of each of the diced semiconductor devices 1 and the insulating material 80 is exposed. Hence, the entire support 10 does not remain on each of the semiconductor devices 1. This can further reduce the package of each of the semiconductor devices 1 in size. The rest of the configuration and a manufacturing method of this modified embodiment may be the same or substantially the same as in the first to third embodiments.

While certain embodiments have been described, these embodiments have been presented by way of example only and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method of manufacturing a semiconductor device, the method comprising:

stacking a plurality of semiconductor chips in a recess formed in a support, the recess extending into the support from a first surface;

forming a plurality of columnar electrodes on the semiconductor chips extending upward toward an opening of the recess;

filling an insulating material into the recess to cover the semiconductor chips and the columnar electrodes with the insulating material;

polishing the insulating material until the first surface of the support and an upper end of each of the columnar electrodes are exposed; and forming a wiring layer on the insulating material and the upper end of each of the columnar electrodes, wherein the upper end of each of the columnar electrodes extends higher than the first surface of the support, and the polishing of the insulating material exposes the upper end of each of the columnar electrodes before the first surface.

2. The method according to claim 1, wherein the support has a hardness different from a hardness of the insulating material.

3. The method according to claim 1, further comprising:

electrically connecting the wiring layer to the columnar electrodes.

4. The method according to claim 1, wherein the support comprises a conductive material.

5. The method according to claim 1, wherein the support comprises a resin.

6. The method according to claim 1, wherein the support comprises a ceramic.

7. The method according to claim 1, wherein a lowermost semiconductor chip in the plurality of semiconductor chips in the recess is adhered to a bottom surface of the recess by an adhesive layer.

8. The method according to claim 1, wherein semiconductor chips in plurality of semiconductor chips are in tiers offset in a planar direction from one another.

9. The method according to claim 8, wherein a lower end of each columnar electrode contacts a tier end portion of the semiconductor chips in the plurality of semiconductor chips.

* * * * *